United States Patent [19]

Kakumoto

[11] Patent Number: 5,473,176
[45] Date of Patent: Dec. 5, 1995

[54] VERTICAL INSULATED GATE TRANSISTOR AND METHOD OF MANUFACTURE

[75] Inventor: Munenari Kakumoto, Kawasaki, Japan

[73] Assignee: Kabushiki Kaisha Toshiba, Kawasaki, Japan

[21] Appl. No.: 296,913

[22] Filed: Aug. 31, 1994

[30] Foreign Application Priority Data

Sep. 1, 1993 [JP] Japan ................................ 5-217604
Aug. 25, 1994 [JP] Japan ................................ 6-200470

[51] Int. Cl.$^6$ ........................ H01L 29/161; H01L 21/265
[52] U.S. Cl. ...................... 257/192; 257/263; 257/284; 257/330; 257/333; 257/341; 257/622; 437/40; 437/107; 437/133; 437/703; 437/228; 437/913
[58] Field of Search ........................ 257/284, 330, 257/333, 192, 263, 341, 622; 437/40, 203, 107, 126, 133, 228, 913

[56] References Cited

U.S. PATENT DOCUMENTS 5,298,780  3/1994  Harada .................... 257/332

*Primary Examiner*—Edward Wojciechowicz
*Attorney, Agent, or Firm*—Oblon, Spivak, McClelland, Maier & Neustadt

[57] ABSTRACT

A vertical insulated gate transistor such as a UMOSFET is manufactured. A source region of first conductivity type is formed on the bottom surface of a substrate. A base region of second conductivity type is formed on the source region. A low-impurity-concentration drift region is formed on the base region. On the top surface of this multilayer structure, a truncated U groove is formed. A buried gate electrode is formed inside the truncated U groove. This structure is effective to reduce gate-drain capacitance Cgd, gate-source capacitance Cgs, and drain resistance $r_d$, thereby realizing a high-frequency high-output device. A distance between the gate and the drain is determined in a self-aligning manner, so that a fine structure and a high-frequency operation are easily realized and production yield is improved.

12 Claims, 13 Drawing Sheets

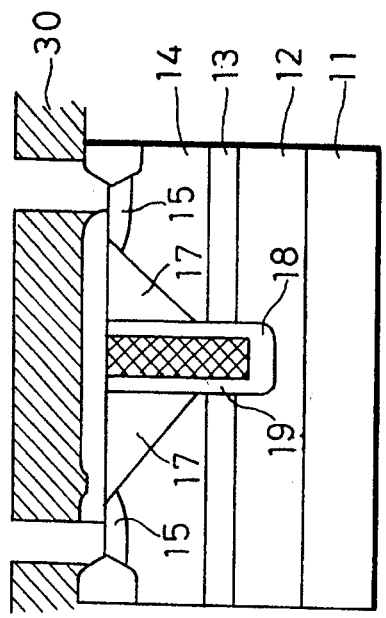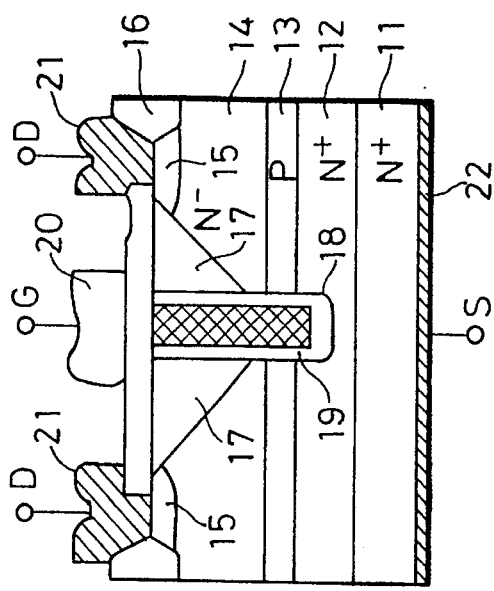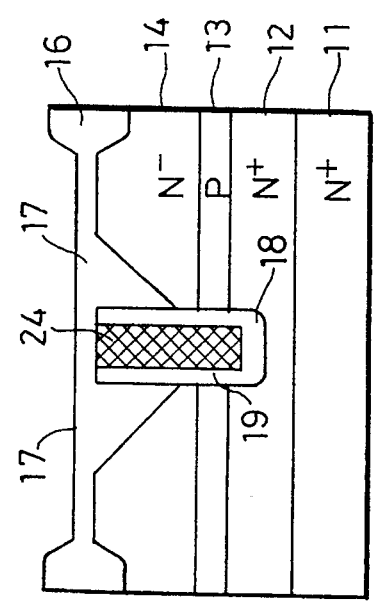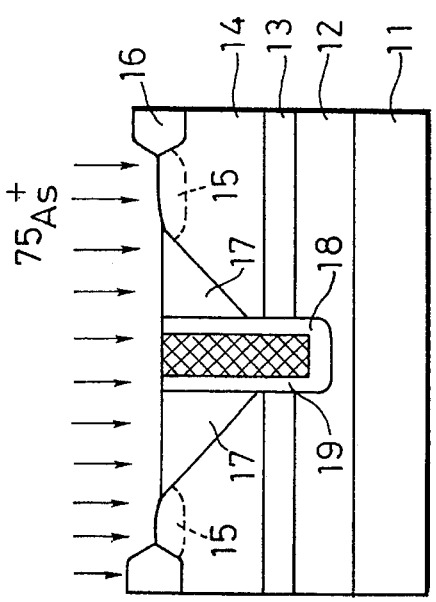

VERTICAL INSULATED GATE TRANSISTOR AND METHOD OF MANUFACTURE

BACKGROUND OF THE INVENTION

1. Field of the Invention

The present invention relates to semiconductor devices such as high-frequency, ultra-high-frequency, high-speed-switching, or power devices and a method of manufacturing the semiconductor devices. In particular, the present invention relates to insulated gate semiconductor devices such as vertical field effect transistors, e.g., U- or V-MOSFETs employing a sidewall of a trench as a gate and a method of manufacturing such devices.

2. Description of the Prior Art

Vertical field effect transistors having a U-shaped groove (hereinafter referred to as the UMOSFETs) are widely used for motor controllers of cars and office automation equipment, communication equipment such as telephone exchanges, power sources, and flat panel display drivers. The vertical insulated gate transistors such as the UMOSFETs are more advantageous than lateral MOSFETs because they have lower ON resistance and smaller chip size.

FIG. 11 is a sectional view showing a UMOSFET according to a prior art. This UMOSFET is of n-channel type. A p-channel UMOSFET is also possible by replacing n with p. In the figure, a first conductivity type is n and a second conductivity type is p. An n+ epitaxial layer 129 serving as a drain region is formed on an n+ substrate 119. An n− epitaxial layer 14 serving as a drift region is formed on the epitaxial layer 129. An n+ region 26 serving as a source region is formed inside a p base layer 25. A U-groove is formed on the top surface of this structure. A gate oxide film 19 is formed along the surface of the U-groove, and a gate electrode 24 made of, for example, polysilicon is formed inside the U-groove. A drain electrode 21 is formed on the bottom surface of the n+ substrate 119. A metal source electrode 22 is formed on the n+ region 26. When this UMOSFET is used as a high-frequency high-speed-switching device, there are the following problems:

(1) The drain electrode 21 is formed on the bottom surface of the device, so that the source electrode 22 must be grounded through a bonding wire. This arrangement increases source inductance $L_s$ serving as floating impedance on the source side, as indicated in an equivalent circuit of FIG. 12. When using this device as a power device, it is necessary to consider heat dissipation. Namely, a highly heat conductive insulation substrate must be employed to separate the drain electrode 21 from the source to be grounded.

(2) The gate electrode 24 faces the drain region 129 with the thin oxide film on the bottom of the U groove interposing between them as indicated with "B" in FIG. 11, to produce large feedback capacitance (gate-drain capacitance Cgd).

(3) The gate electrode 24 and source region 26 are separated from each other with the thin oxide film (gate oxide film) 19 as indicated with "A" in FIG. 11, to produce large input capacitance (gate-source capacitance Cgs).

SUMMARY OF THE INVENTION

An object of the present invention is to provide a vertical insulated gate transistor such as a UMOSFET employing a gate having an improved configuration to reduce gate-drain capacitance Cgd and gate-source capacitance Cgs, and a method of manufacturing the same.

Another object of the present invention is to provide a semiconductor device such as a vertical insulated gate transistor having a source electrode on the bottom surface of the transistor with the source electrode being grounded with no bonding wire, to reduce grounding inductance, drain capacitance, input capacitance, and feedback capacitance and improve heat dissipation characteristics and high-frequency high-output characteristics, and a method of manufacturing the same.

Still another object of the present invention is to provide a semiconductor device such as a UMOSFET whose gate-drain dimensions are determined in a self-aligning manner with constant gate-drain capacitance Cgd and good reproducibility, and a method of manufacturing the same.

Still another object of the present invention is to provide a semiconductor device whose gate-drain dimensions and drain contact holes are determined in a self-aligning manner, to reduce drain resistance Rd and improve high-frequency characteristics, and a method of manufacturing the same.

In order to accomplish the objects, a first aspect of the present invention provides a semiconductor device of FIG. 1. This device is a vertical insulated gate transistor. A source electrode 22 is formed on the bottom surface of a substrate 11 of first conductivity type. A drain electrode 21 is formed on the substrate 11. Although the device of FIG. 1 is a UMOSFET, the present invention is applicable to other types of vertical insulated gate transistors such as HEMTs (High Electron Mobility Transistors) and UMOS-SITs (UMOS Static Induction Transistors).

A second aspect of the present invention provides a semiconductor device having a truncated U groove (hereinafter referred to as the TU groove) shown in FIG. 1. The configuration around the gate of this device has V-shaped upper groove part and a U-shaped bottom. The TU groove cuts through a high-impurity-concentration semiconductor layer 14 of first conductivity type and a base layer 13 of second conductivity type, to reach a high-impurity-concentration epitaxial layer 12 of first conductivity type serving as a source region. The bottom of the TU groove is filled with a thick oxide film 18. A sidewall of the TU groove in contact with the base layer 13 has a thin gate oxide film 19. Above this zone, the V-shaped portion has a thick oxide film 17.

Inside the TU groove, another U groove filled with a gate electrode 24 is formed. The gate electrode 24 has a vertical sidewall and is formed from polysilicon. A high-impurity-concentration region 15 of first conductivity type serving as a drain region is small and formed on the layer 14. Between the drain region 15 and the gate electrode 24, the thick oxide film 17 is present to reduce gate-drain capacitance Cgd. The gate electrode 24 and source region 12 face each other with the thick oxide film 18 formed on the bottom of the TU groove interposing between them, to reduce gate-source capacitance Cgs. Consequently, input capacitance and feedback capacitance are reduced, to realize a high-frequency operation. The source electrode 22 formed on the bottom surface of the substrate 11 enables the source to be easily grounded with no bonding wire. This results in reducing the inductance $L_s$ of the source and easily achieves a high-frequency operation. According to the present invention, a heat dissipation substrate or a heat spreader is not necessarily an insulation substrate, so that the present invention easily dissipates heat and realizes a high output operation.

FIGS. 8 and 9 show manufacturing processes of a semiconductor device according to the present invention.

(1) A first process continuously epitaxially grows a source region 12, a base region 13, and a drift region 14 on a high-impurity-concentration substrate 11 of first conductivity type and forms a TU groove on the top surface of this epitaxial-multilayer structure.

(2) A second process fills the bottom of the TU groove with a thick layer 18 made of, for example, insulation material whose width of the forbidden gap, or energy band gap Eg is wider than that of the base region 13, forms a gate insulation film 19 from, for example, $SiO_2$ whose energy band gap Eg is wider than that of the base region silicon, on a vertical sidewall of the TU groove adjacent to the base region 13, and forms a gate electrode 24 with vertical sidewall made of high-conductivity material at the center of the TU groove adjacent to the gate insulation film 19. Another example for wide band gap material 17 is AlGaAs formed along the sidewall of narrow band gap GaAs as a base region 13.

(3) A third process forms, at upper part of the TU groove, material 17 such as an insulation film whose band gap Eg is wider than that of the base region 13 and employs the material 17 as a mask to selectively form a drain region 15 in a self-aligning manner. For example, $SiO_2$ may be the wide band gap material 17 and silicon is the narrow band gap material for base region 13.

The third process is characteristic to the present invention. The lateral thickness of the material 17 at the upper part of the TU groove determines a distance between the gate electrode 24 and the drain region 15 without employing the fine mask alignment technology, so that it is easy to manufacture, at good yield, a very fine structure having high-frequency characteristics.

Other and further objects and features of this invention will become obvious upon an understanding of the illustrative embodiments about to be described in connection with the accompanying drawings or will be indicated in the appended claims, and various advantages not referred to herein will occur to one skilled in the art upon employing of the invention in practice.

BRIEF DESCRIPTION OF THE DRAWINGS

FIGS. 8A to 8H are sectional views explaining a method of manufacturing the semiconductor device of the first embodiment;

DETAILED DESCRIPTION OF THE EMBODIMENTS

Figure 1:
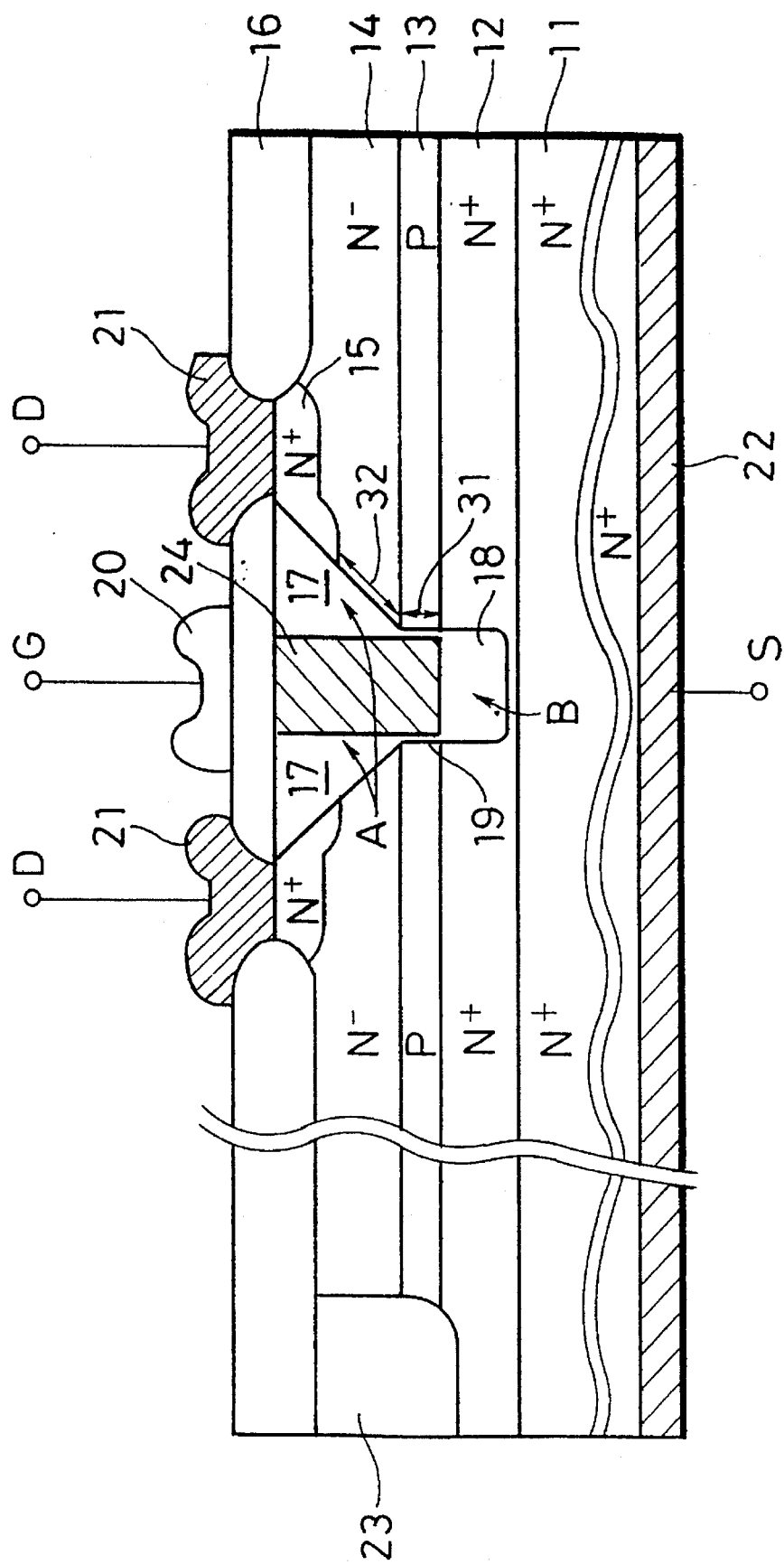
FIG. 1 is a sectional view taken along a line I—I of FIG. 2, showing a semiconductor device (a vertical field effect transistor) according to a first embodiment of the present invention.

Various embodiments of the invention will be described with reference to the accompanying drawings. It should be noted that the same or similar reference numerals are applied to the same or similar parts and elements throughout the drawings and the description of the same or similar parts and elements will be omitted or simplified.

Figure 11:
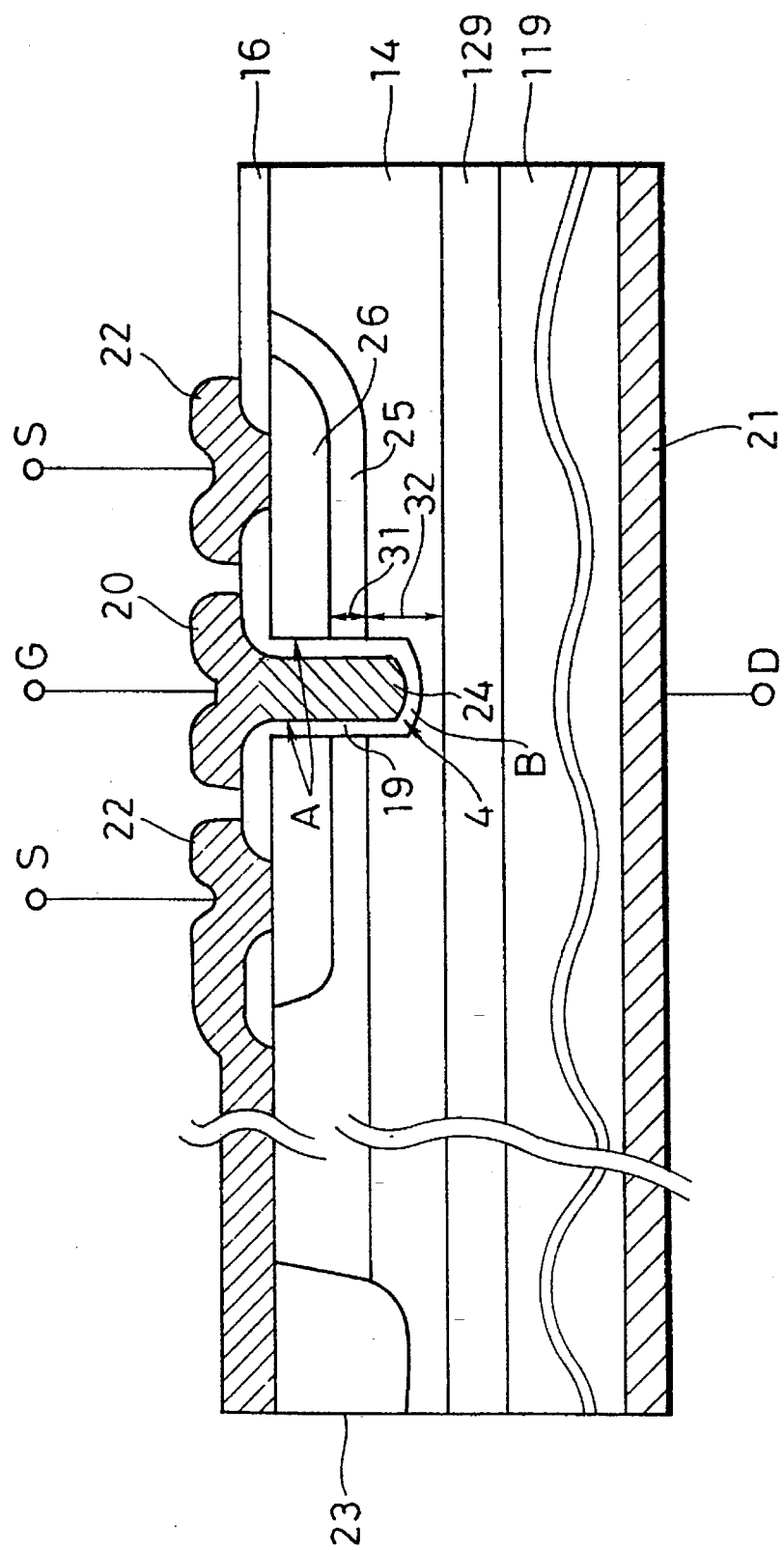
FIG. 11 is a sectional view showing a UMOSFET according to a prior art.
Figure 12:
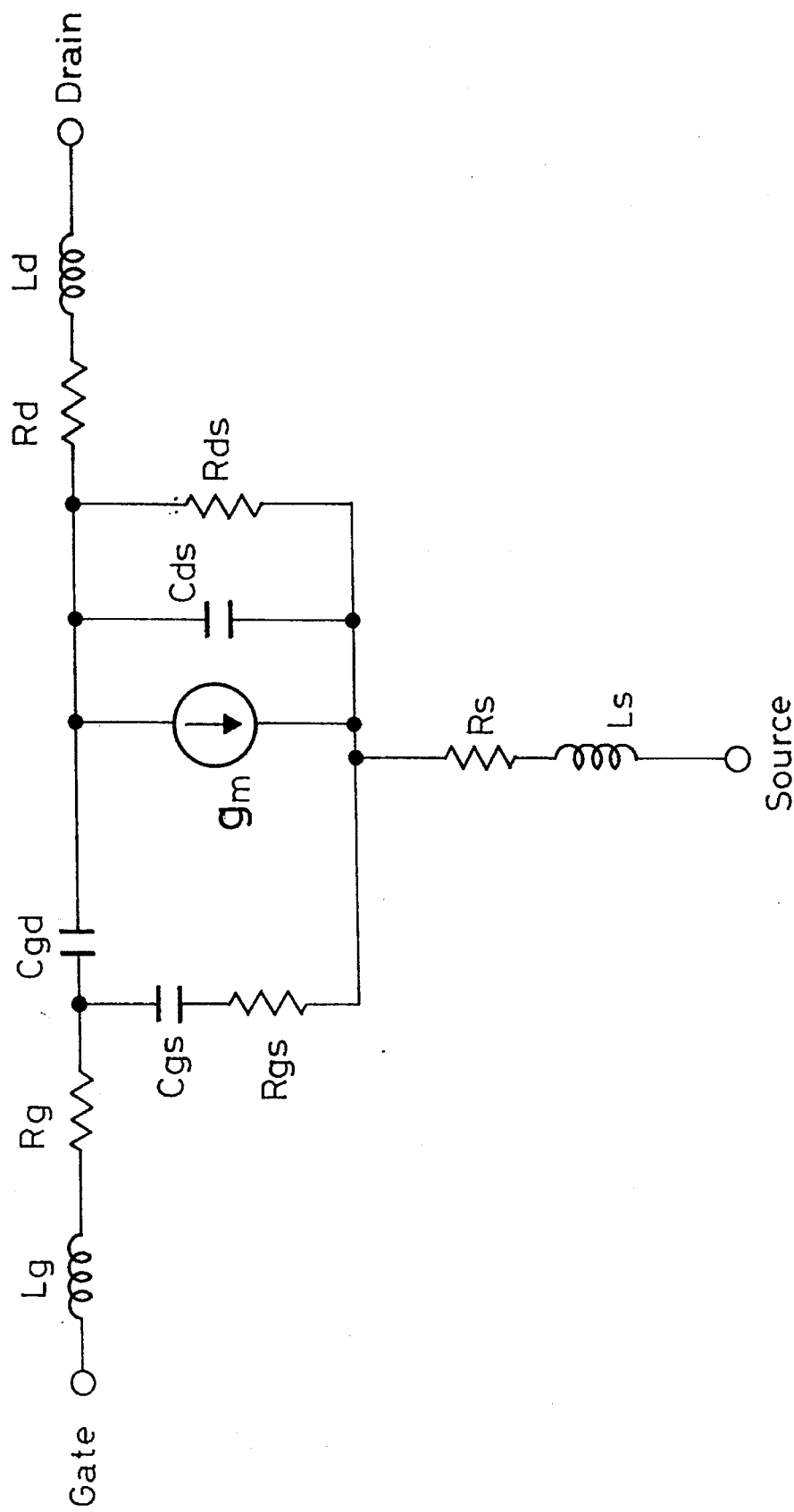
FIG. 12 is an equivalent circuit of a high-frequency FET.

FIG. 1 shows a semiconductor device according to the first embodiment of the present invention. In the figure, the same parts as those of the prior art of FIG. 11 are represented with like reference numerals. The semiconductor device of FIG. 1 is a vertical UMOSFET of n-channel type with "n" being a first conductivity type and "p" a second conductivity type. The n and p are replaceable with each other. A source electrode 22 is formed on the bottom surface of an n+ substrate 11. An epitaxial layer 14 is formed on the substrate 11 and a drain electrode 21 is contacted on the drain region 15 formed on the top surface of the epitaxial layer 14.

A truncated U groove (TU groove) is formed, cutting through the epitaxial layer (n− drift layer) 14 and a p base layer 13, to reach an n+ source region 12. Unlike an ordinary U groove, the TU groove of this embodiment has a V-shaped top opening or truncated opening. A thick insulation film 18 is formed on the bottom of the TU groove. The band gap Eg of insulation film 18 is wider than that of semiconductor epitaxial layer 14, 13, 12. A gate insulation film 19 such as $SiO_2$ is formed on a vertical sidewall of the TU groove facing the p base layer 13. The Eg of $SiO_2$ is approximately 8.0 eV and that of silicon 1.1 eV. A gate electrode 24 with vertical sidewall made of, for example, doped polysilicon is buried in the center (core) of the TU groove adjacent to the gate insulation film 19. The n− drift layer 14 may be a p− drift layer. The cross-sectional area of the buried gate electrode 24 must be small to realize a high-frequency operation. The resistance of the gate electrode 24 with small cross-sectional area may cause a problem. Accordingly, refractory metal such as W, Mo, and Ti, or refractory metal silicides such as $WSi_2$, $MoSi_2$, and $TiSi_2$ may be employed instead of the doped polysilicon. Alternatively, polycide. i.e., a composite film of doped polysilicon and refractory metal silicides may be employed. The other remaining part of the TU groove is filled with a thick wide band gap material or insulation film 17. As shown in FIG. 1, an n+ drain region 15 is locally formed with a small area.

Figure 2:
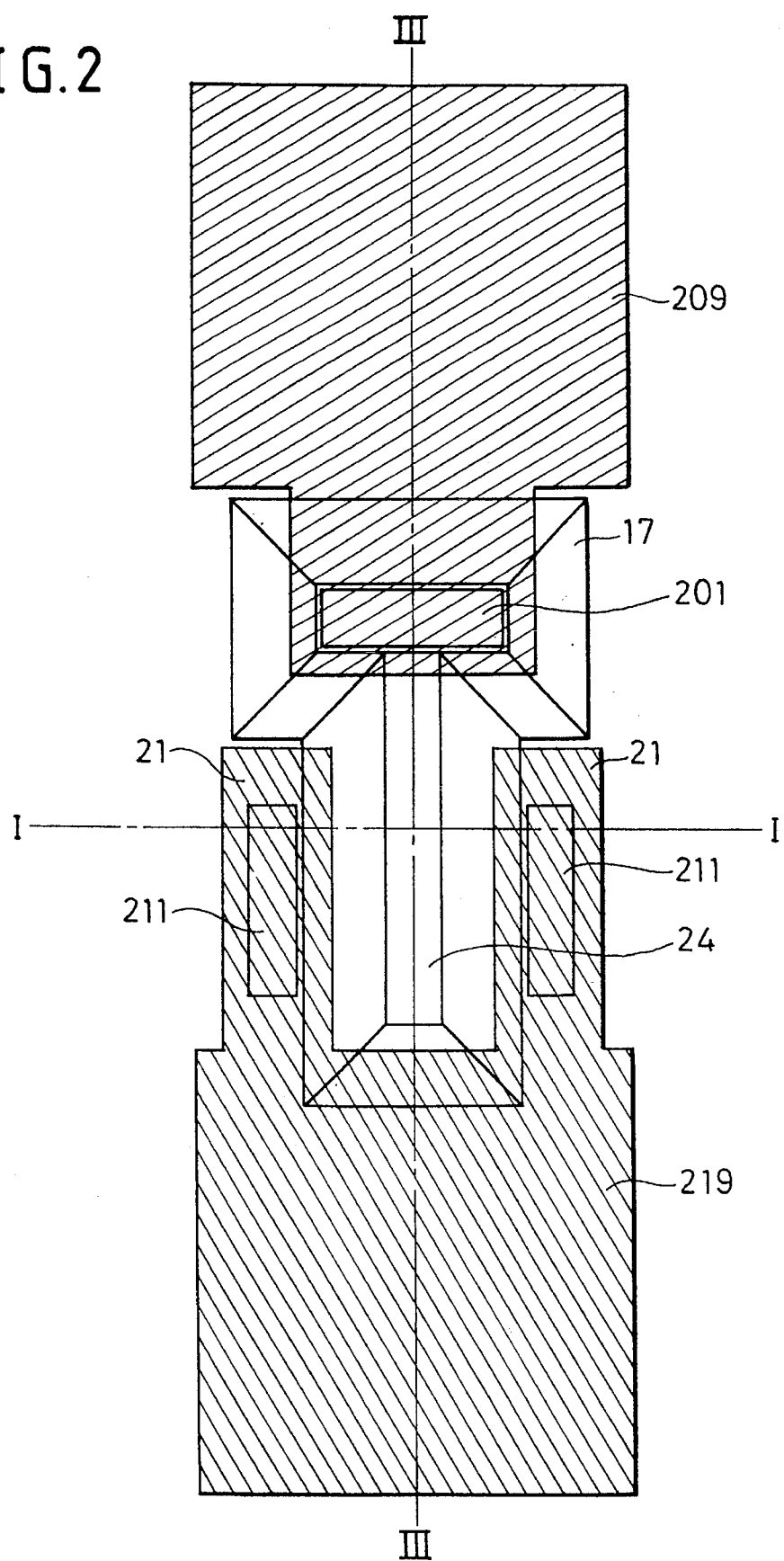
FIG. 2 is a plan view showing the semiconductor device according to the first embodiment.
Figure 3:
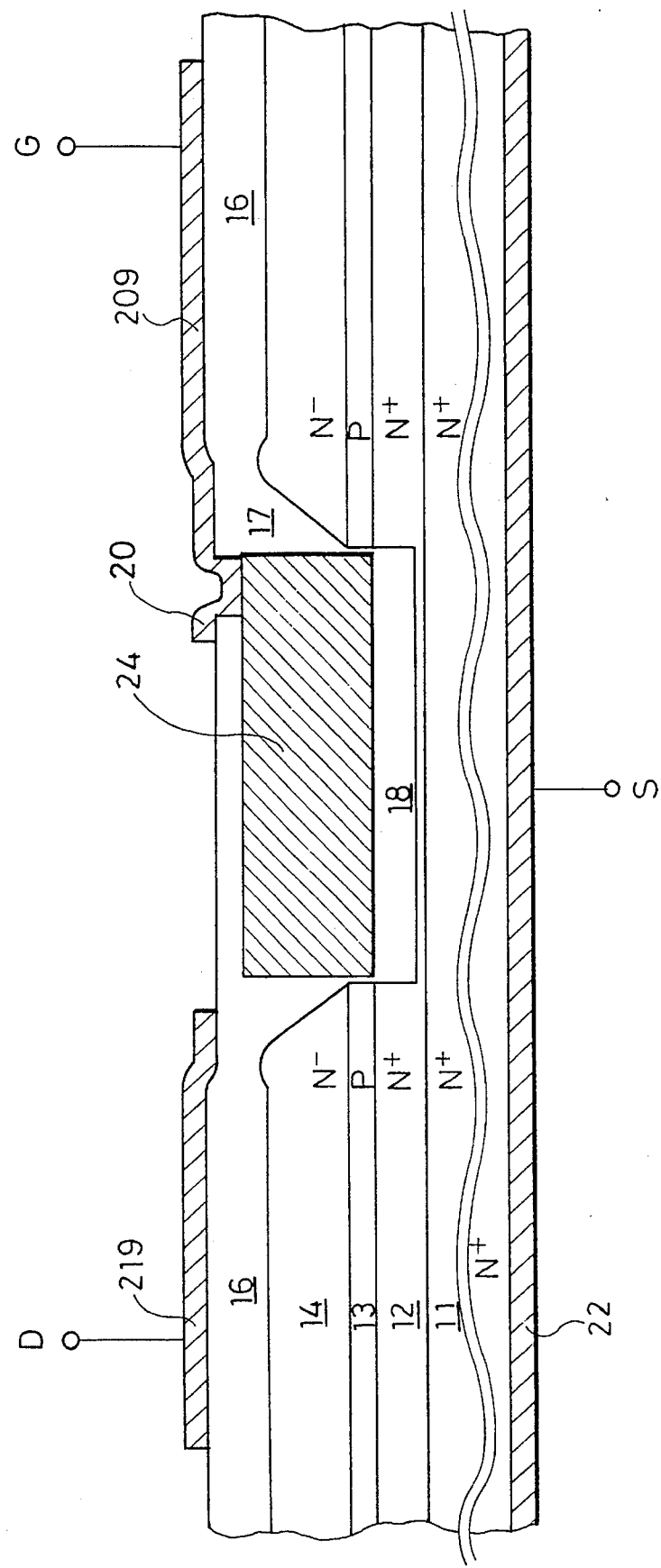
FIG. 3 is a sectional view taken along a line III—III of FIG. 2.

A metal drain electrode 21 and a metal gate electrode 20 made of Al or Al—Si are not present on the same cross-sectional plane. As shown in FIGS. 2 and 3, the metal gate electrode 20 is connected to the buried gate electrode 24 through a gate contact hole 201 positioned at a longitudinal end of the buried gate electrode 24. The gate electrode 20 is guided to a gate bonding pad 209. In FIG. 1, only the metal gate electrode 20 is not sectioned and is present at inner part of the figure. In FIGS. 2 and 3, the n+ drain region 15 is guided to a drain bonding pad 219 through drain contact holes 211.

For purpose of simplification and illustration reference will be made herein to UMOSFET, in which the wide band gap material 17 is $SiO_2$ and semiconductor 11, 12, 13, 14, 15 is silicon; it should however be understood, that the term "UMOSFET" is used herein to denote vertical insulated gate transistor. The operation of the truncated UMOSFET (hereinafter referred to as the TUMOSFET) is based on the inverted operation of an ordinary UMOSFET. Accordingly, the TUMOSFET becomes enhancement type or depletion type depending on the impurity concentration and thickness of the p base layer 13 and the surface level of an interface between the p base layer 13 and the gate oxide 19 in the TU groove. When it is of the enhancement type, positive potential is applied to the buried gate electrode 24, to form an n channel 31 around the interface between the p base layer 18 and the gate oxide 19 in the TU groove, to turn ON the TUMOSFET. Namely, electrons exceeding a potential barrier in the n channel 31 are injected into the n– drift region 14. Due to a high built-in electric field in the drift region 14, the injected electrons travel at their scattering-limited velocities to reach the n+ drain region 15. The base layer 13 must be sufficiently thin to realize a high-frequency operation. The drift layer 14 must be sufficiently thick depending on a breakdown voltage $V_{GBD}$ so that a transit-time of electrons causes no trouble. For a frequency of about 2.5 GHz, the drift layer 14 may be about 10 micrometers thick to easily provide a breakdown voltage of 60 to 100 V.

If the strength of an electric field caused by the n+ drain region 15 controls the height of the potential barrier in the n channel 31, the TUMOSFET acts as a static induction transistor (SIT), so that $I_D$-$V_D$ characteristics change from a saturation type to an unsaturation type. If the p base layer 13 is further thinned to below a mean free path of electrons, electrons ballistically transport at their thermionic velocities, to realize a high-frequency operation of about 200 to 1000 GHz. The thickness of the n– drift layer 14 is determined so that a transit angle of electrons becomes $(\frac{3}{2})\pi$. This results in increasing a breakdown voltage for a high-frequency operation without reducing gain.

Figure 10:
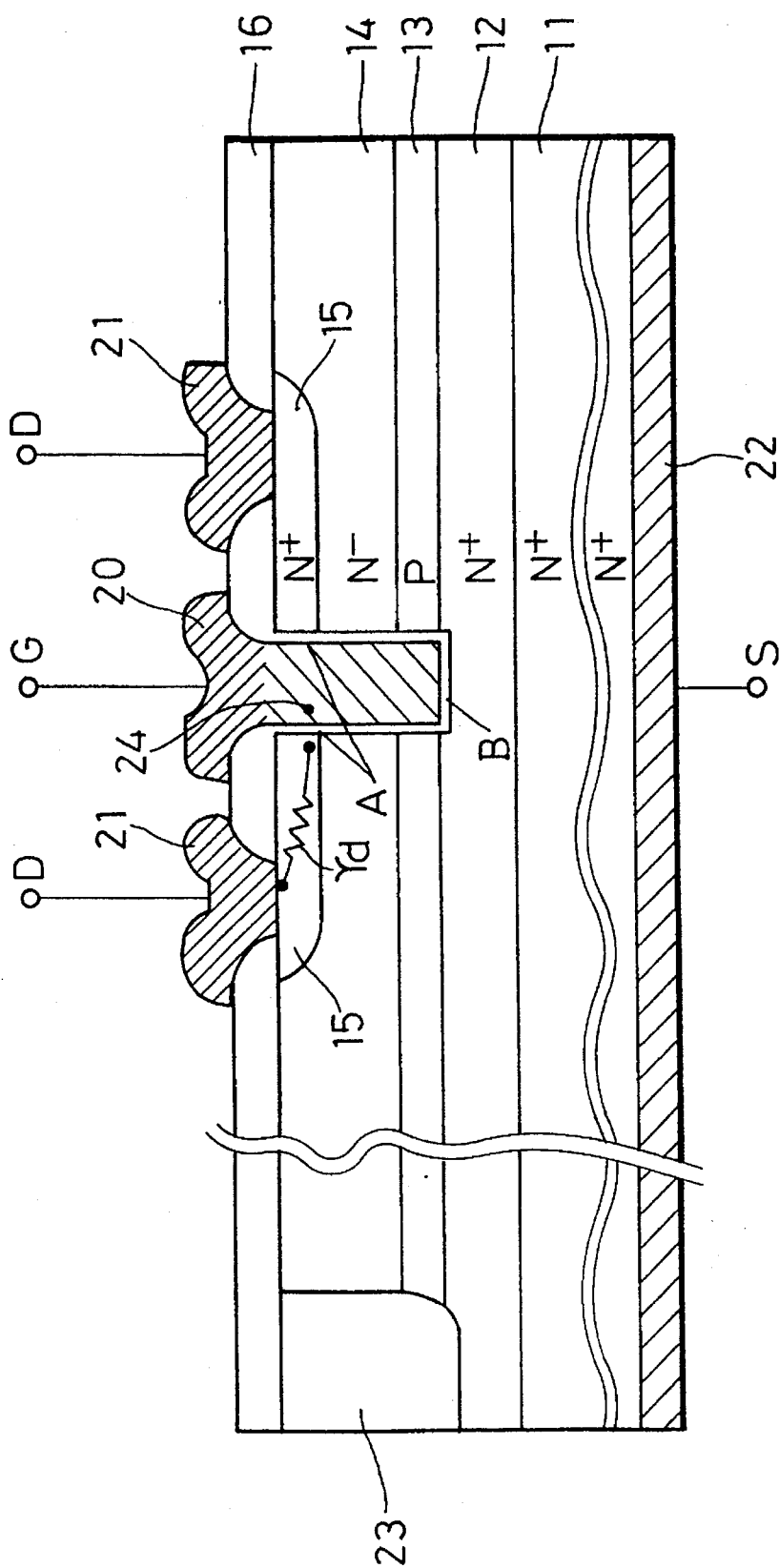
FIG. 10 is a sectional view showing a UMOSFET having a source electrode formed on the bottom surface of a substrate.

The triangular-shaped thick oxide film 17 is formed between the buried gate electrode 24 and the n+ drain region 15, to reduce gate-drain capacitance Cgd. As explained above, the metal gate electrode 20 and metal drain electrode 21 are not on the same sectional plane, so that the capacitance Cgd between the metal gate electrode 20 and the metal drain electrode 21 is ignorable. Feedback capacitance is as follows due to Miller effect:

$$(|A|+1) \cdot Cgd$$

where A is an amplification factor. This influences input impedance. Accordingly, a decrease in the capacitance Cgd is quite effective to increase frequency. In FIG. 1, the thick oxide film 18 is disposed on the bottom of the TU groove, to reduce gate-source capacitance Cgs. The capacitance Cgs is not simply linearly calculable according to the thickness of the oxide film 18. Namely, a two-dimensional calculation according to the shape of the bottom of the TU groove must be carried out to calculate the capacitance Cgs. According to a very rough approximation, the thickness of the oxide film 18 may be 10 times the thickness of the gate oxide film 19, to make the capacitance Cgs $\frac{1}{10}$ that of an upside-down UMOSFET of FIG. 10, which is a mere reference figure for comparison with the TUMOSFET of FIG. 1. The upside-down transistor of FIG. 10 has the same gate configuration as that of FIG. 11 but a source region 22 formed on the bottom surface of a substrate 11.

The bottom surface of the substrate 11 of FIG. 1 is the source electrode 22, which is easily grounded with no lead wire. Accordingly, the source inductance Ls becomes ignorable, and the device easily operates at a high frequency over 1 GHz. The source electrode may directly be connected to a heat spreader metal substrate or metal heat sink. In this case, an insulation substrate made of expensive BeO or AlN is not needed, to help reduce cost, provide good heat dissipation, and realize high output.

Figure 4:
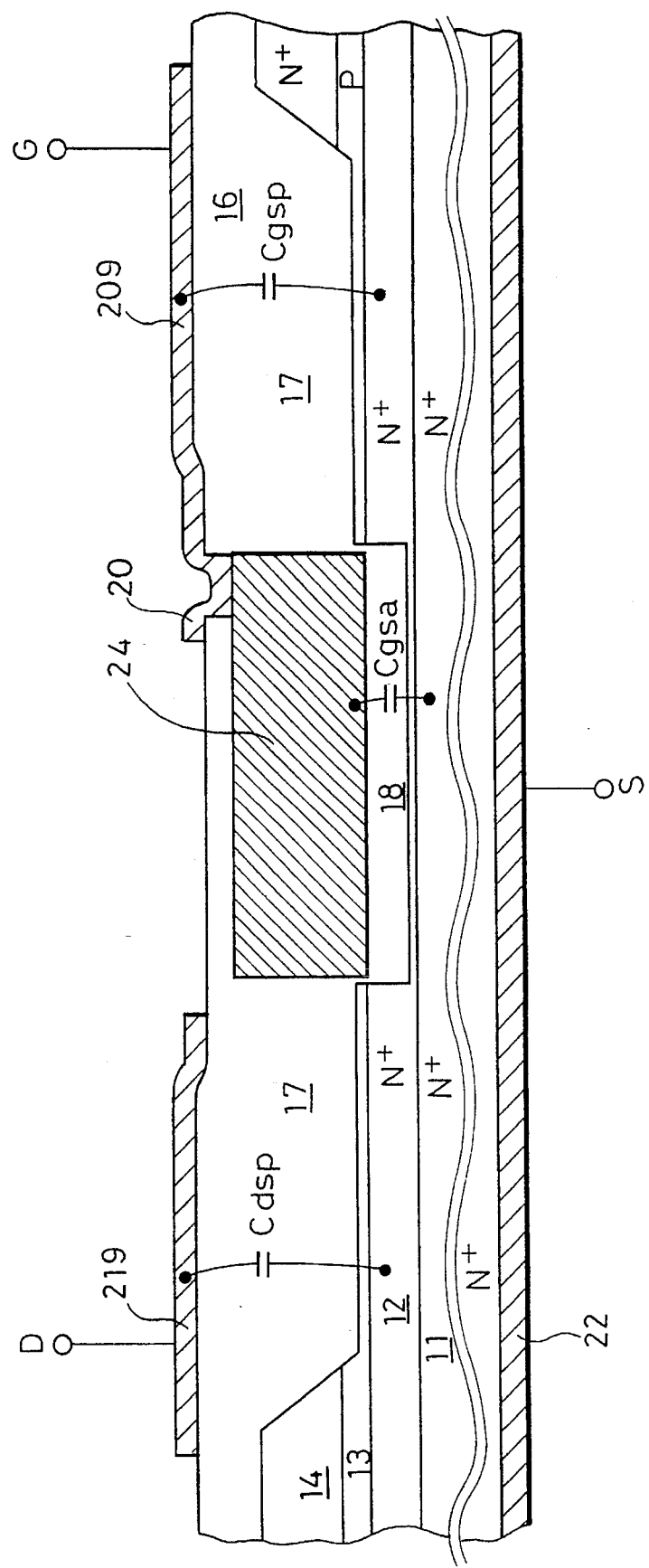
FIG. 4 is a sectional view showing part under bonding pads of a semiconductor device according to a second embodiment of the present invention.

FIG. 4 is a sectional view showing a UMOSFET according to the second embodiment of the present invention. A thick oxide film 17 is formed under a gate bonding pad 209 and a drain bonding pad 219. The thick oxide film 17 is buried in a V groove formed in a process of FIG. 8C. The size of each bonding pad is usually 200 micrometers square, and the area of bonding pads are equal to or larger than an active region of MOSFET where a TU groove is formed. According to the structure of the first embodiment of FIG. 3, capacitance Cgsp under the pad 209 and capacitance Cdsp under the pad 219 become prominent if capacitance Cgsa in the active region decreases. According to the structure of FIG. 4, the capacitances Cgsp and Cdsp under the bonding pads greatly decrease to $\frac{1}{3}$ that of FIG. 3 or smaller.

Figure 5:
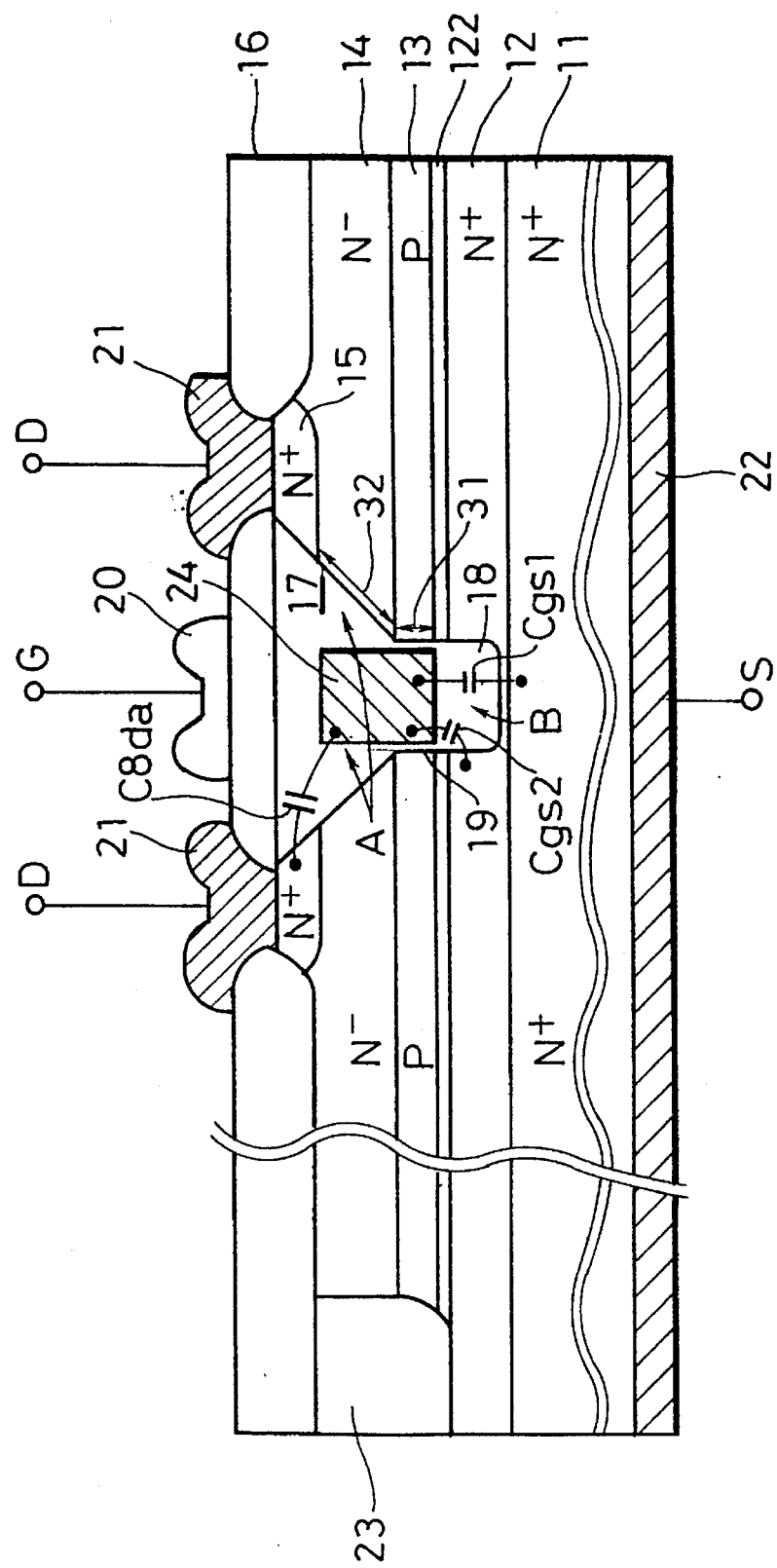
FIGS. 5, 6, and 7 are sectional views showing semiconductor devices according to third, fourth, and fifth embodiments of the present invention, respectively.

FIG. 5 shows the third embodiment of the present invention. This embodiment further reduces the gate-drain capacitance Cgda and gate-source capacitance Cgsa in an active region. A gate electrode 24 is completely buried inside a thick oxide film 17, having an oxide film 17 on the top surface of the gate electrode 24, and an n+ drain region 15 and the buried gate electrode 24 are not on the same horizontal plane. Accordingly, the capacitance Cgda becomes very small. This structure is formed by oxidizing the polysilicon of the buried gate electrode 24 of FIG. in steam at 900 to 1050 degrees centigrade for 30 minutes to two hours. If the buried gate electrode 24 is made of refractory metal such as W or TI, a selective CVD method is carried out in a U groove 28 and stopped in the middle of the CVD process and SiO$_2$ is deposited on the refractory metal to fully bury the U groove. Instead, the upper part of the U groove may be etched back after filling up of the U groove by vacuum evaporation or spattering. Thereafter, SiO$_2$ is deposited according to the CVD method or a vacuum deposition method. In FIG. 5, a thin n– region 122 is formed between an n+ source region 12 and a p base region 13. As explained with reference to the first embodiment, the gate-source capacitance Cgsa is not calculable according to a parallel-plate condenser approximation but a two-dimensional analysis is required. However, as a very rough approximation, the capacitance Cgsa will be a parallel circuit of parallel-plate condenser approximation capacitance Cgs1 and capacitance Cgs2 between the n+ source region 12 along a sidewall of the U groove 28 and the buried gate electrode 24. Namely, the capacitance Cgsa is expressed as follows:

$$Cgsa = Cgs1 + Cgs2$$

If the width $t_w$ of the U groove 28 is nearly equal to the thickness $t_b$ of the thick oxide film 18, i.e., if an aspect ratio $t_b/t_w$ is nearly 1, Cgs1<<Cgs2 when the thickness $t_b$ is sufficiently large. Consequently, the capacitance Cgs2 is prominent in the capacitance Cgsa. Even if the thickness $t_b$ of the thick oxide film 18 is more than 10 times the thickness $t_g$ of the gate oxide film 19, there will be no meaning. Accordingly, $5 \leq t_b/t_g \leq 10$ is appropriate. In this case, the thickness and the carrier concentration of the n– region 122 of FIG. 5 is designed to be completely depleted to reduce the capacitance Cgs2. As a result, the capacitance Cgsa becomes very small. If the width $t_w$ of the U groove 28 is wide so that $t_b/t_w < 0.1$, Cgs1>>Cgs2. In this case, the n– region 122 will not be inserted.

Figure 6:
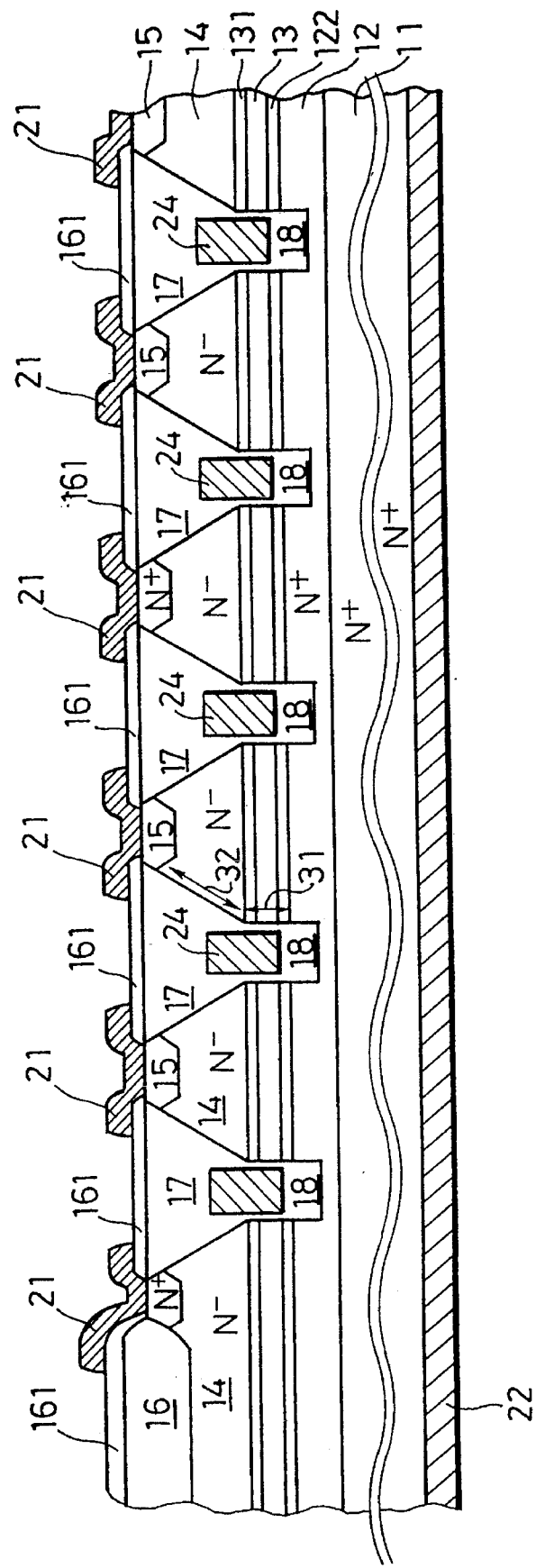

FIG. 6 is a sectional view showing the fourth embodiment of the present invention. This is a multichannel UMOSFET having many unit cells connected in parallel. What is different from the embodiment of FIG. 5 is that $Si_{1-x}Ge_x$ such as $Si_{0.5}Ge_{0.5}$ layer 131 is inserted between a p base layer 13 and an n– drift layer 14. The band gap Eg of the layer 131 is narrower than that of Si of the p base layer 13, to form a heterojunction. This heterojunction forms a potential barrier in a current path, i.e., a channel 31 between the source 12 and the drain 15, even if the p base layer 13 is very thin. Accordingly, this structure is proper for an ultra-high-speed device in which electrons ballistically transport. A gate voltage controls a tunnel current passing over the barrier at the heterojunction interface of $Si$—$Si_{1-x}Ge_x$. If the device operates at a relatively low frequency of 1 GHz to 10 GHz, the $Si_{1-x}Ge_x$ layer 131 may be omitted to simplify manufacturing processes. One of the characteristics of the present invention is that a source electrode is directly connected and grounded to a heat dissipation substrate or heat sink. This is suitable for a multichannel large current device such as one shown in FIG. 6. Similar to the embodiments of FIGS. 2 and 3, buried gate electrodes 24 are connected to one another at inner part of FIG. 6 and guided to a gate bonding pad. The buried gate electrodes 24 and drain electrodes 21 are inter-digitally formed each other in a plan view (not shown). For small power application, the one unit cell shown in FIG. 6 can be employed.

Figure 7:
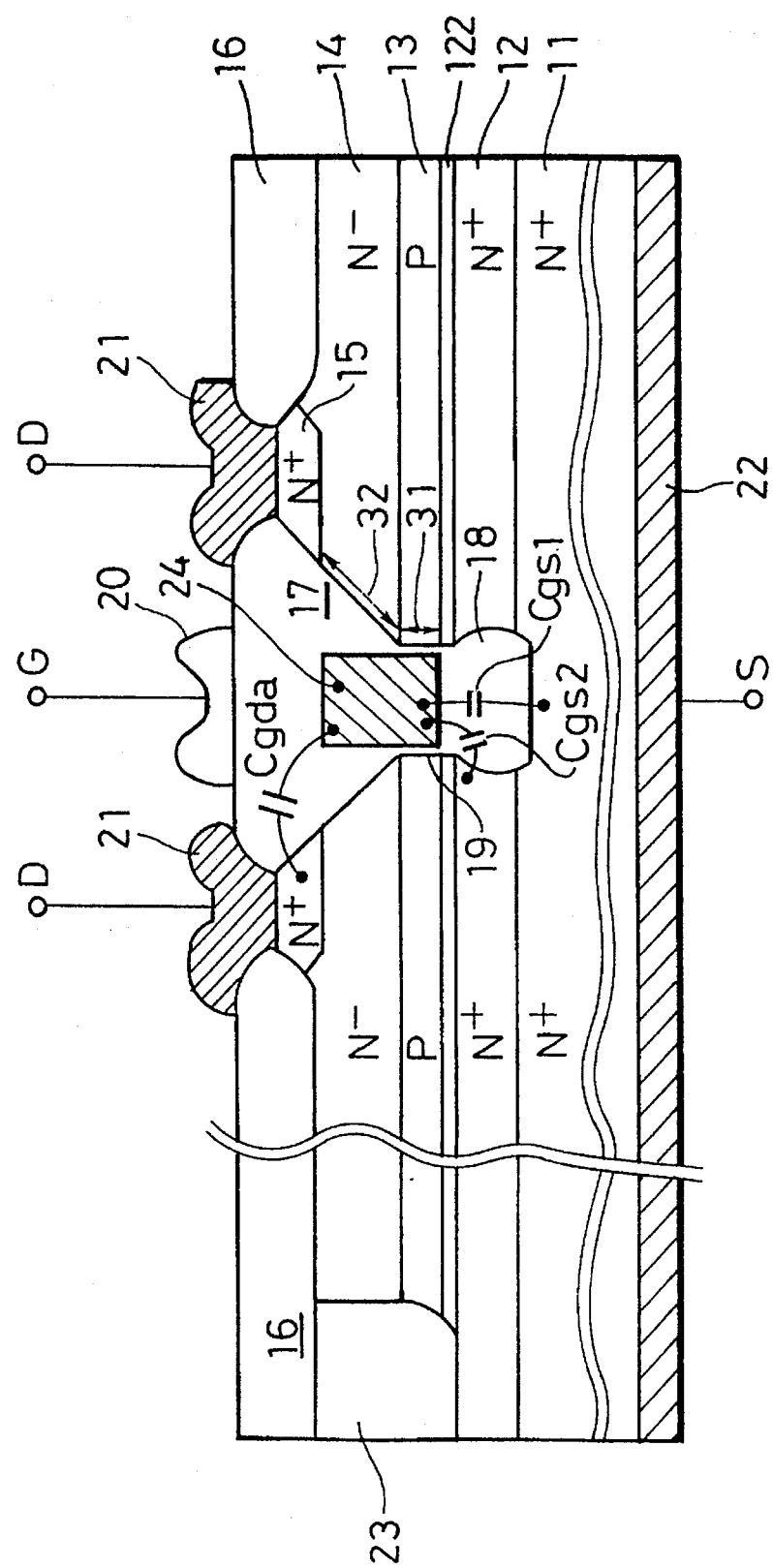

FIG. 7 shows the fifth embodiment of the present invention. This embodiment further reduces the capacitance Cgsa. A thick oxide film 18 extends under a p base layer 13 to further reduce the capacitance Cgs2. This structure is realized by a LOCOS method shown in FIG. 9.

A method of manufacturing the semiconductor device of FIG. 1 will be explained with reference to FIGS. 8A to 8H.

Figure 8A:
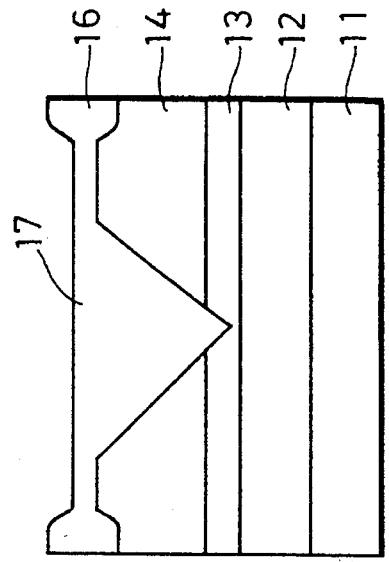

(a) Figure shows an n+ substrate 11 having an impurity concentration $n=2\times10^{18}$ to $10^{19}$ cm$^{-3}$. On the n+ substrate 11, an n+ layer 12 serving as a source region is epitaxially grown to 0.5 to 3 micrometers with an impurity concentration of $10^{18}$ to $10^{21}$ cm$^{-3}$. On the n+ layer 12, a p layer 13 serving as a p base layer is epitaxially grown to 2 to 0.2 micrometers with an impurity concentration of $2\times10^{16}$ to $1\times10^{18}$ cm$^{-3}$. An n– layer 14 is epitaxially grown to 0.5 to 7 micrometers with an impurity concentration $n=5\times10^{12}$ to $1\times10^{15}$ cm$^{-3}$. Instead of the n– layer 14, a p– layer of $p=5\times10^{12}$ to $10^{15}$ cm$^{-3}$ may be formed. These epitaxial layers are continuously grown according to a gas phase epitaxial growth method with $SiCl_4$, $SiHCl_3$, $SiH_2Cl_2$, and hydrogen when Si is used. When GaAs is used, an MOCVD method is employed with TMG, TEG, and $AsH_3$. When Si is used, dopant gases may be $ASH_3$, $PH_3$, and $AsCl_3$ for n type, and $B_3H_6$ for p type. When GaAs is used, dopant gases may be $SiH_4$, $Si_2H_6$, and DESe for n type, and DEZn for p type. To manufacture ballistic devices operating at 1000 GHz or over, an MBE (Molecular Beam Epitaxy) method and an MLE (Molecular Layer Epitaxy) method are employable to continuously epitaxially grow npn structure to form atomic or molecular layers. For example, the MLE method with Si is achieved by alternately introducing $SiH_2Cl_2$ and $H_2$. After continuously growing the epitaxial layers, an insulation film 166 is formed by thermal oxidization or CVD with $SiO_2$, $Si_3N_4$, $SiO_xN_{1-x}$, etc. As shown in FIG. 8A, a thick insulation film 16 serving as a field oxide film is formed on the top surface of the epitaxial layers around a device region (active region), and then, the thin insulation film 166 such as an oxide film may be formed only in the device region. It is possible to omit the field oxide film 16. The field oxide film 16 may be formed according to a known method such as the LOCOS method in the case of silicon devices.

Figure 8C:
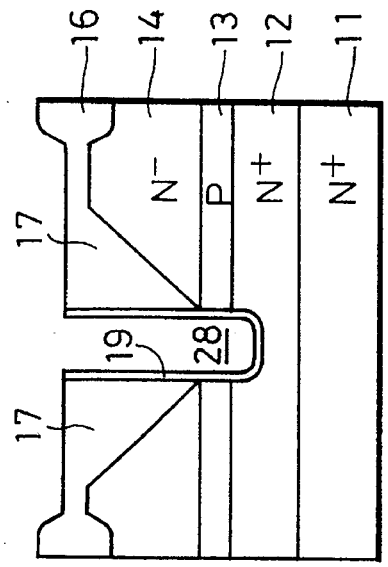
Figure 8B:
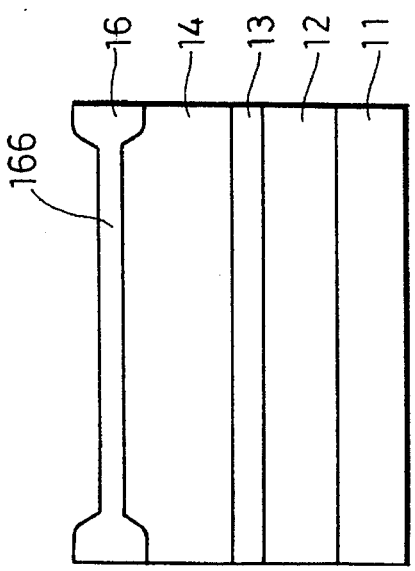

(b) An ordinary photolithography method using photoresist is employed to form an opening at the center of the insulation film 166 as shown in FIG. 8B. The insulation film 166 having the opening is used as a mask to etch the continuous epitaxial layers 14 and 13. When the substrate 11 is an n+ (100) S1 substrate, the longitudinal direction of the V groove 27 orthogonal to the plane of the figure may be selected as a direction <110>, to carry out anisotropic etching. For example, the etching is carried out with a KOH solution, to form the V groove 27 having a face (111) on the Si surface, as shown in FIG. 8B. Accordingly, the surface of the V groove 27 forms 54.74 degrees with respect to the surface of the epitaxial layers that are not etched. In this way, the angle of the sidewall of the V groove is determined according to anisotropy of crystals, and therefore, the etching process is self-stopping and the depth of the V groove is precisely determined according to the size of the opening in the insulation film 166. Dry etching with $PCl_3$ and $SiCl_4$ can also form the V groove 27 on the Si surface. In the case of GaAs, gas etching with HCl and photo excited dry etching with $Ci_2$ and $Br_2$ are also possible. To narrow the width of a U groove formed in the next process, the V groove 27 may not reach the p base layer 13. The surface of the V groove 27 may be, for example, (333) instead of (111) and angles other than 54.74 degrees are possible according to etching conditions such as etchants and the temperature of the substrate.

(c) As shown in FIG. 8C, the inside of the V groove 27 is completely filled with insulation material 17 according to, for example, the CVD method with $SiO_2$. Alternatively, a thin thermal oxide film is formed on the surface of the V groove, films of $SiO_2$ and SiN are deposited according to the CVD method, polysilicon is deposited according to the CVD method, and the polysilicon is thermally oxidized. Instead, an $SiO_2$ film is deposited according to a vacuum deposition method. It is possible to employ an SOG (spin on glass) method that spin-casts resin glass dissolved in a solution such as alcohol on a rotating wafer. After the film deposition of a solution containing the oxide precursor by spinning or dipping, the wafer is cured and densificated to produce the oxide with the SOG method. To smooth the surface of the insulation film 17, a thermal smoothing reflow method with PSG and BPSG, or a mechanical lapping method is carried out. Some surface irregularities that cause no trouble in photolithography are allowable. In the case of GaAs, the insulation film 17 is made of AlGaAs or ZnSe whose band gap Eg is wider than the band gap Eg of GaAs.

Figure 8D:
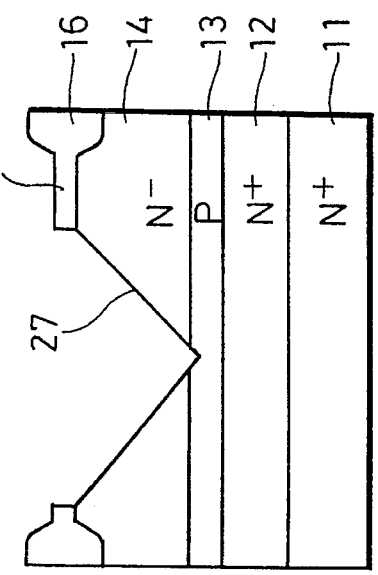

(d) As shown in FIG. 8D, the U groove (trench) 28 is formed at the center of the V groove down to the n+ source layer 12. To reduce the gate-source capacitance Cgs, the U groove 28 may be formed down to the n+ substrate 11. The U groove 28 is formed by continuously etching $SiO_2$ and Si according to an ECR (electron cyclotron resonance) ion etching method with use of $C_3F_8$ or $CHF_3$. Alternatively, an RIE (reactive ion etching) method is employed to etch $SiO_2$ part with $C_3F_8$ and Si part with $SF_6/Cl_2$, $PCl_3$, $SICl_4$, etc. Sacrificial oxidization, wet etching, or gas etching is carried out to remove a damaged layer due to the U groove etching. A gate oxide film 19 is formed on the surface of the U groove 28 to a thickness of 30 to 100 nanometers. In the case of GaAs HFET (insulated gate Heterostructure FET) or HEMT, an AlGaAs thin film is formed over the surface of the GaAs U groove according to the MOCVD or MLE method.

(e) As shown in FIG. 8E, the bottom of the U groove 28 is filled with insulation material 18 such as a thick oxide film up to the level of the lower part of the p base layer 13. It may be filled with material whose Eg is greater than that of the p base layer 13. Preferably, SiO₂ is deposited according to the MBE or vacuum deposition method with good directivity under low pressure less than $10^{-7}$ Pa. The last process of FIG. 8D may be changed. Namely, the SiO₂ 18 may be deposited at first on the bottom of the U groove 28, and then the gate oxide film 19 is formed. In this case, unnecessary SiO₂ will not deposit on the surface of the gate oxide film 19 when the thick oxide film 18 is deposited, to further improve the breakdown voltage of the gate oxide film 19. The buried insulation film 18 on the bottom of the U groove 28 may be formed by SIMOX that implant oxygen ions of 1.8 to $2.0 \times 10^{18}$ cm⁻² at 190 to 200 key. In this case, the bottom of the U groove 28 is etched to the same level as the bottom of the p base layer 13. After the oxygen ions are injected, the bottom of the U groove 28 is etched by about 200 nanometers, and oxygen ions are again injected. This method is also effective. Any of the gate oxide film 19 and buried insulation film 18 can be formed at first. Thereafter, doped polysilicon is deposited as shown in FIG. 8E, to completely fill the U groove 28 and form a buried gate electrode 24. The surface of the electrode 24 is capping oxidized. The doped polysilicon may be of n type. To improve enhancement characteristics, p-type doped polysilicon is preferable for p base layer 13. As explained with reference to FIG. 1, it is preferable to employ refractory metal such as W, Mo, and Ti, refractory metal silicides such as $WSi_2$, $MoSi_2$, and $TiSi_2$, or polycides employing p-type doped polysilicon. The refractory metal may be deposited by vapor deposition or spattering, preferably CVD, more preferably a reduced pressure CVD (LPCVD).

(f) As shown in FIG. 8F, the top surface is slightly etched to expose the n– drift layer 14, and an ion implantation window is opened. Ions such as $^{75}As^+$ and $^{31}p^+$ are injected where a source region is formed. The material is annealed at 800 to 1000 degrees centigrade for 15 to 30 minutes to activate the ion implanted layer. Or, a flash-lamp annealing method may be employed, to activate the ion implanted layer. The ion implantation opening may be formed by photolithography. However, since the triangular-shaped thick oxide film 17 is formed on the top surface of the TU groove surrounding the buried gate electrode 24, slight etching for the thickness of the oxide film 166 is sufficient to open the ion implantation window. Accordingly, no photolithography is needed. As explained in (a), there is the thick field oxide film 16 except the device region (active region), so that no ions will be implanted other than the active region. Namely, without photolithography, the n+ drain region 15 is formed in a self-aligning manner in the active region. A gate-drain distance is irrelevant to a mask alignment error and is accurately determined. Mask aligner such as steppers of the present technology have a mask aligning margin of about ±0.2 micrometers, so that the above method is particularly effective to form a fine structure less than this margin. Even if the gate-drain distance is one to two micrometers, no fluctuation occurs in mask alignment. Accordingly, the gate-drain capacitance Cgd is precisely determined, to provide a semiconductor device having stabilized high-frequency characteristics at good reproducibility. In the case of GaAs, ions such as $^{79}Se^+$ and $^{28}Si^+$ may be implanted. Since the ion implantation requires a heat treatment, it is preferable to employ the MLE method to selectively epitaxially grow Se- or Si-doped GaAs or InGaAs at the opening part shown in FIG. 8F. In particular, InGaAs has smaller Eg than GaAs, to reduce the contact resistance of a drain electrode to realize a higher frequency operation.

(g) As shown in FIG. 8G, a gate contact hole, drain contact holes, and a source contact hole on the bottom surface are opened by photolithography. The heat treatment in the inert atmosphere such as He, Ar or N₂ after the ion implantation forms substantially no oxide film over the surface of the drain region 15, so that the ion implantation window may be used as the contact holes. In this case, the contact holes are opened in a self-aligning manner. As explained with reference to FIG. 1, the gate contact hole and drain contact holes are not on the same sectional plane. The gate contact hole is open at inner part of the figure.

(h) Metal is deposited over the contact hole openings by vapor deposition, spattering, or CVD. The metal electrodes are patterned by photolithography and RIE. FIG. 8H shows a completed semiconductor device according to the present invention having the metal gate electrode 20, metal drain electrode 21, and metal source electrode 22. The source electrode 22 may be soldered or alloyed to a substrate having high-frequency strip lines. Lead wires connected to the metal gate electrode 20 and metal drain electrode 21 are connected to an input/output impedance matching circuit.

According to these processes, a gate-drain distance is determined in a self-aligning manner, so that a fine structure is easily manufactured to realize a high-frequency operation. The drain contact holes are opened in a self-aligning manner, so that the drain electrode is formed in the vicinity of the TU groove where a current path is formed. This results in shortening a gap between an effective channel and the drain electrode, to reduce drain resistance Rd, thereby further improving the high-frequency operation. This is apparent through a comparison with the upside-down UMOSFET of FIG. 10 having no TU groove. After contact holes are opened by photolithography in FIG. 10, a distance from a drain electrode contact hole to an effective channel is large to increase the resistance Rd.

FIG. 9 shows a method of manufacturing the semiconductor device according to the fifth embodiment of the present invention of FIG. 7. This method is particularly effective for a UMOSFET employing Si. This method partly employs the processes of FIG. 8. Namely, epitaxial layers are continuously grown as shown in FIG. 8A, a V groove 27 is formed as shown in FIG. 8B, insulation material 17 is formed in the V groove as shown in FIG. 8C, and a U groove (trench) 28 is formed at the center of the V groove as shown in FIG. 8D.

Figure 9A:
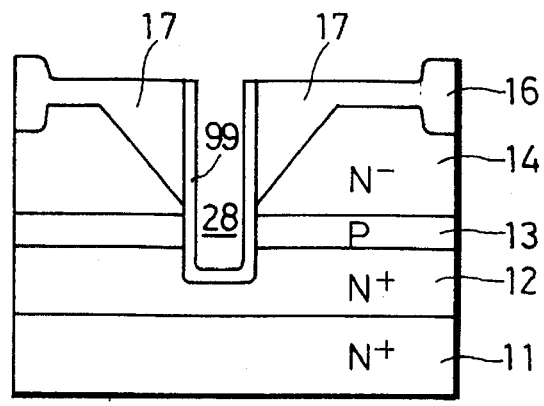
FIGS. 9A to 9D are sectional views explaining a method of manufacturing the semiconductor device of the fifth embodiment.

The difference between the process shown in FIG. 8 and FIG. 9 is just below. The processes of FIG. 8 form the gate oxide film 19 Just after the formation of the U groove. But the method of FIG. 9 does not form the gate oxide and carries out the following processes after the formation of the U groove 28:

(a) A thin oxide pad film of about 10 nanometers thick is formed in the U groove 28. On the pad film, an $Si_3N_4$ film 99 of 130 to 180 nanometers thick is formed by reduced pressure CVD as shown in FIG. 9A. If the opening of the U groove 28 is wide, an atmospheric pressure CVD method may be employed.

Figure 9B:
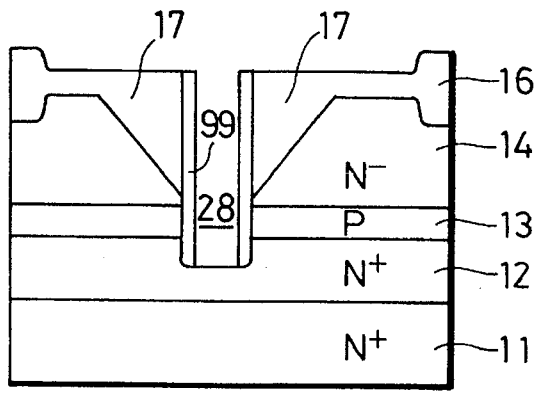

(b) The $Si_3N_4$ film 99 and pad film on the bottom of the U groove 28 are removed by low-pressure RIE with $CF_4$ or $C_3F_8$, or by ECR ion etching with $C_3F_8$. Since this is a highly directive etching, the $Si_3N_4$ film is left on the sidewall of the U groove as shown in FIG. 9B.

Figure 9C:
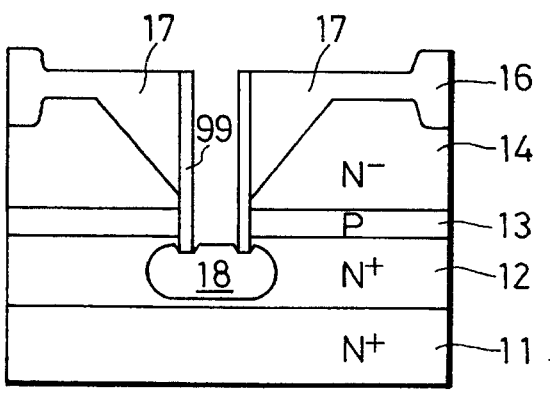

(c) The $Si_3N_4$ film on the sidewall is used as a mask to carry out selective oxidization (LOCOS). Namely, thermal oxidization is carried out in steam at 1050 degrees centigrade for about three hours, as shown in FIG. 9C.

Figure 9D:
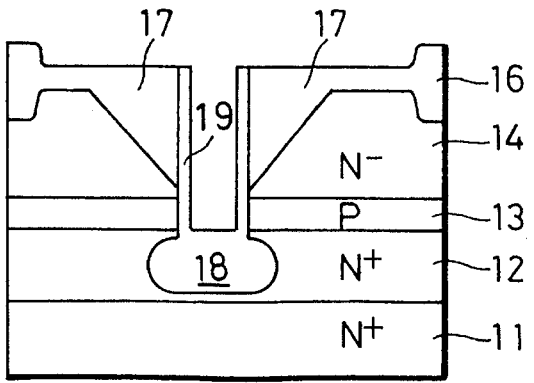

(d) The $Si_3N_4$ film is removed from the sidewall by thermal phosphoric acid or dry etching with $CF_4$, and a gate oxide film 19 is formed as shown in FIG. 9D.

Thereafter, the processes of FIG. 8E onward are carried out to complete a structure having an under-cut portion under the p base layer 13.

The structure of FIG. 7 according to the fifth embodiment of the present invention is effective to reduce not only Cgda and Cgs1 but also Cgs2, thereby easily achieving a high-frequency operation. The thick oxide film 18 under the buried gate electrode 24 is a thermal oxidization film, so that the quality of the film is sufficient to realize a high breakdown voltage, a small leak current, and low noise. The depth of the under-cut portion under the p base layer 13 is controlled according to the time and temperature of the thermal oxidization (LOCOS), to allow a great degree of freedom in designing. The processes of FIGS. 9A to 9D are most appropriate for Si. These processes are also applicable for materials other than Si, if the selective oxidization method is applicable to the materials. For example, an $Si_3N_4$ film may be used to anode-oxidize a GaAs surface. An $Al_2O_3$ mask may be employed to selectively oxidize the GaAs surface with oxygen plasma. The fifth embodiment of FIG. 7 may be achieved by SIMOX. In this case, a mask whose width of the window is slightly wider than the width $t_w$ of the U groove 28 is employed to implant oxygen ions to form an oxide film under the p base layer 13. The depth of the ion implantation by SIMOX, however, is practically about 500 nanometers due to damages on crystals. Accordingly, the processes of FIGS. 9A to 9D are more preferable to manufacture high-frequency high-output devices operating at 1 to 5 GHz. For example, these processes are applicable for manufacturing UMOSFETs for microwave ovens (2.5 GHz). For further fine structures, e.g., submillimeter amplification, or oscillation devices, the SIMOX is appropriate.

Various modifications will become possible for those skilled in the art after receiving the teachings of the present disclosure without departing from the scope thereof.

What is claimed is:

1. A vertical insulated gate transistor having a source electrode on its bottom surface comprising:

a high-impurity-concentration first semiconductor region of first conductivity type serving as a source region;

a second semiconductor region of second conductivity type formed on said first semiconductor region;

a low-impurity-concentration third semiconductor region formed on said second semiconductor region;

a truncated U groove formed from the top surface of said third semiconductor region and substantially reaching to said first semiconductor region;

a high-impurity-concentration fourth semiconductor region of first conductivity type serving as a drain region formed on the top surface of said third semiconductor region along each side of said truncated U groove;

material disposed on the bottom and sidewall of said truncated U groove having a wider band gap than said second semiconductor region; and a buried gate electrode having a vertical sidewall, buried in said material having a wider band gap, wherein the upper part of said truncated U groove has sidewalls that are oblique with respect to horizontal surface plane of said third semiconductor region and the lower part of said truncated U groove has sidewalls that are substantially vertical and facing to said second semiconductor region so that the width of an opening of said upper part of said truncated U groove on the top surface of said third semiconductor region is greater than the width of said lower part of said truncated U groove in the vicinity of an interface between said second semiconductor region and said third semiconductor region, and the lateral thickness of said material is thicker in the vicinity of the top surface of said third semiconductor region than that in the vicinity of the interface between said third semiconductor region and said second semiconductor region, and a distance between the bottom of said buried gate electrode and the bottom of the truncated U groove below said buried gate electrode is larger than a distance between said vertical sidewall of said buried gate electrode and said second semiconductor region.

2. A vertical insulated gate transistor as claimed in claim 1, wherein said material is an insulator.

3. A vertical insulated gate transistor as claimed in claim 2, wherein said insulator is an oxide.

4. A vertical insulated gate transistor as claimed in claim 1 or 2, further comprising:

a low-impurity-concentration fifth semiconductor region of first conductivity type formed between said first semiconductor region and said second semiconductor region.

5. A vertical insulated gate transistor as claimed in claim 1 or 2, further comprising:

a sixth semiconductor region having a narrower band gap than said second semiconductor region, formed between said second and third semiconductor regions.

6. A vertical insulated gate transistor as claimed in claim 1 or 2, wherein said first semiconductor region is an epitaxial film grown on a high-impurity-concentration substrate of first conductivity type.

7. A vertical insulated gate transistor as claimed in claim 1 or 2, wherein said fourth semiconductor region has a narrower band gap than said third semiconductor region.

8. A method of manufacturing a vertical insulated gate transistor, comprising the steps of:

(1) continuously epitaxially growing a first semiconductor region of first conductivity type having a high-impurity-concentration, a second semiconductor region of second conductivity type, and a third semiconductor region having a low-Impurity-concentration on a substrate of first conductivity type having a high-impurity concentration serving as a source region, and forming a truncated U groove from the top surface of the third semiconductor region to reach the first semiconductor region;

(2) disposing a wide band gap material having a wider band gap than the second semiconductor region on the bottom and sidewall of the truncated U groove, and burying high conductive material in the wide band gap material to form a buried gate electrode; and (3) forming a high-impurity-concentration fourth semiconductor region of first conductivity type serving as a drain region on the top surface of the third semiconductor region in a self-aligning manner employing said wide band gap material as a mask.

9. A method of manufacturing a vertical insulated gate transistor as claimed in claim 8, wherein the truncated U groove is formed in said step (1) by:

forming a V-shaped groove serving as an upper part of said truncated U groove on the top surface of the third semiconductor region;

filling the V-shaped groove with said wide band gap material; and etching said wide band gap material to form a trench in the center of said V-shaped groove, and further etching the semiconductor regions downward to the first semiconductor region to form a U groove serving as a lower part of said truncated U groove.

10. A method of manufacturing a vertical insulated gate transistor as claimed in claim 8, wherein the fourth semiconductor region is formed in said step (3) by a selective epitaxial growth in the window part of said wide band gap material serving as a mask.

11. A method of manufacturing a vertical insulated gate transistor as claimed in claim 8, wherein said wide band gap material disposed on the bottom of the truncated U groove in said step (2) is an oxide film formed by implanted oxygen ions, and a gate oxide film on the sidewall of the truncated U groove is formed by thermal oxidization.

12. A method of manufacturing a vertical insulated gate transistor, comprising the steps of:

(1) continuously epitaxially growing a high-impurity-concentration first semiconductor region of first conductivity type, a second semiconductor region of second conductivity type, and a low-impurity-concentration third semiconductor region on a high-impurity-concentration substrate of first conductivity type serving as a source region, forming a V-shaped groove on the top surface of the third semiconductor region, filling the V-shaped groove with wide band gap material having a wider band gap than the second semiconductor region, and forming a U groove at the center of the V-shaped groove downward to the first semiconductor region, to thereby form a truncated U groove;

(2) forming an oxidization resistive film only on the sidewall of the U groove, selectively oxidizing the bottom of the U groove with use of the oxidization resistive film, to form a thick oxide film only on the bottom of the U groove, removing the oxidization resistive film, forming a gate oxide film on the sidewall of the U groove, and filling the U groove with highly conductive material serving as a gate electrode; and (3) employing said wide band gap material as a mask and forming a high-impurity-concentration fourth semiconductor region of first conductivity type serving as a drain region on the top surface of the third semiconductor region in a self-aligning manner.

\* \* \* \* \*